(12) United States Patent
Toshiyuki

(10) Patent No.: US 9,866,010 B2
(45) Date of Patent: Jan. 9, 2018

(54) ELECTRIC POWER CONVERSION DEVICE

(71) Applicant: Toyota Jidosha Kabushiki Kaisha, Toyota-shi, Aichi-ken (JP)

(72) Inventor: Ken Toshiyuki, Seto (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/200,845

(22) Filed: Jul. 1, 2016

(65) Prior Publication Data

US 2017/0012555 A1 Jan. 12, 2017

(30) Foreign Application Priority Data

Jul. 8, 2015 (JP) .................................. 2015-137190

(51) Int. Cl.

| H02M 7/5387 | (2007.01) |
|---|---|
| H02H 7/122 | (2006.01) |
| H02M 1/32 | (2007.01) |
| H03K 17/082 | (2006.01) |
| H03K 17/18 | (2006.01) |
| H02M 1/08 | (2006.01) |
| H02M 1/00 | (2006.01) |

(52) U.S. Cl.
CPC ............ *H02H 7/1227* (2013.01); *H02M 1/32* (2013.01); *H03K 17/0828* (2013.01); *H03K 17/18* (2013.01); *H02M 1/08* (2013.01); *H02M 7/5387* (2013.01); *H02M 2001/0009* (2013.01)

(58) Field of Classification Search
CPC ............... H02M 1/38; H02M 7/53875; H02M 2001/0009; H02P 23/0027; H02P 2101/45; H03K 17/082

USPC ............ 363/56.04, 56.02, 132; 318/800, 810
See application file for complete search history.

(56) References Cited

U.S. PATENT DOCUMENTS

| 4,617,622 A * | 10/1986 | Fox .................... H02M 7/53875 |
| | | 363/132 |
| 5,278,482 A * | 1/1994 | Bahn ..................... H02K 19/103 |
| | | 318/400.37 |
| 6,304,472 B1 | 10/2001 | Nagasu et al. |
| 6,678,180 B2 * | 1/2004 | Matsuda ................. H02M 1/38 |
| | | 318/810 |
| 6,909,620 B2 * | 6/2005 | Park ...................... H02M 1/088 |
| | | 363/56.04 |
| 8,760,891 B2 * | 6/2014 | Lloyd .................... H03K 17/18 |
| | | 363/56.04 |

(Continued)

FOREIGN PATENT DOCUMENTS

| JP | H07-131316 A | 5/1995 |
| JP | 2000-324846 A | 11/2000 |

(Continued)

*Primary Examiner* — Rajnikant Patel
(74) *Attorney, Agent, or Firm* — Oliff PLC

(57) ABSTRACT

An electric power conversion device includes: a switching element; a collector side wiring connected to a collector side of the switching element; an emitter side wiring connected to an emitter side of the switching element; a detection circuitry configured to detect an induction voltage generated in the collector side wiring or the emitter side wiring when a current flows through the collector side wiring or the emitter side wiring; and a comparison circuitry configured to compare the induction voltage detected by the detection circuitry and a predetermined threshold voltage determined in advance to each other.

11 Claims, 14 Drawing Sheets

(56) References Cited

U.S. PATENT DOCUMENTS

| | | | |
|---|---|---|---|
| 9,520,807 B2* | 12/2016 | Takubo | ............. H02M 7/53871 |
| 2002/0089321 A1 | 7/2002 | Matsuda | |
| 2014/0192449 A1 | 7/2014 | Shimizu | |
| 2016/0241242 A1 | 8/2016 | Toshiyuki | |

FOREIGN PATENT DOCUMENTS

| | | |
|---|---|---|
| JP | 2001-169533 A | 6/2001 |
| JP | 2002-204581 A | 7/2002 |
| JP | 2007-259533 A | 10/2007 |
| JP | 2013-223275 A | 10/2013 |
| JP | 2014-117112 A | 6/2014 |
| JP | 2014-190773 A | 10/2014 |
| JP | 2016-149715 A | 8/2016 |
| WO | 2013/008452 A1 | 1/2013 |

* cited by examiner

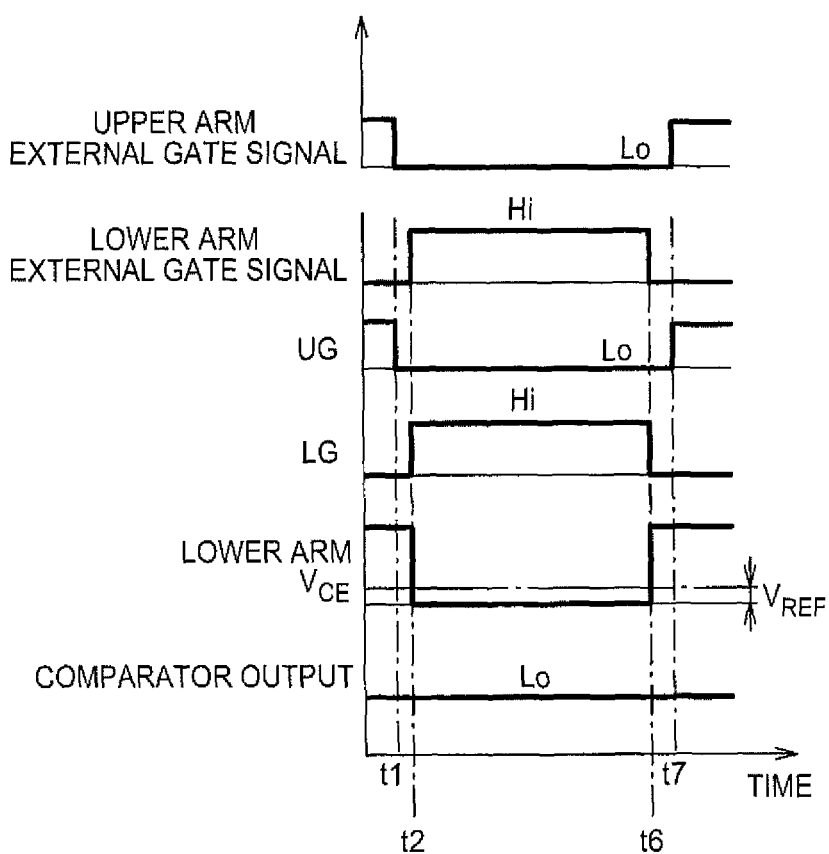

ELECTRIC POWER CONVERSION DEVICE

INCORPORATION BY REFERENCE

The disclosure of Japanese Patent Application No. 2015-137190 filed on Jul. 8, 2015 including the specification, drawings and abstract is incorporated herein by reference in its entirety.

BACKGROUND OF THE INVENTION

1. Field of the Invention

The invention relates to an electric power conversion device and, more particularly, to an electric power conversion device that is capable of performing a detection of whether or not a current flowing through a switching element is a short circuit current.

2. Description of Related Art

It is preferable that a detection of whether or not a current flowing through a switching element is a short circuit current is performed in a quick manner.

As an example, Japanese Patent Application Publication No. 2001-169533 (JP 2001-169533 A) discloses a Rogowski coil being disposed for detection of a current change rate of a main current that flows through the switching element of an electric power conversion device.

In the method for placing the Rogowski coil in series in the switching element, an induction voltage that is generated in the Rogowski coil is a temporal differentiation of the current, and thus it can be detected within a short period of time whether or not the current flowing through the switching element is the short circuit current. An erroneous detection arises when an external magnetic field is in the Rogowski coil as a noise. In the Rogowski coil, however, a loop has to be made with the coil in a current path of an object to be measured, which results in an increase in cost and an increase in mounting area.

SUMMARY OF THE INVENTION

The invention provides an electric power conversion device that allows a detection of whether or not a current flowing through a switching element is a short circuit current to be quickly performed without a Rogowski coil being externally added.

An electric power conversion device according to an aspect of the invention includes a switching element, a collector side wiring connected to a collector side of the switching element, an emitter side wiring connected to an emitter side of the switching element, a detection circuitry configured to detect an induction voltage generated in the collector side wiring or the emitter side wiring when a current flows through the collector side wiring or the emitter side wiring, and a comparison circuitry configured to compare the induction voltage and a predetermined threshold voltage determined in advance to each other.

The electric power conversion device according to the aspect of the invention detects the induction voltage generated by a wiring inductance of the emitter side wiring or the collector side wiring when the current flows through the emitter side wiring connected to the emitter side of the switching element or the collector side wiring connected to the collector side of the switching element. The wiring inductance of the emitter side wiring and the wiring inductance of the collector side wiring are generally referred to as a parasitic inductance for an inductance component of a wiring material and a wiring arrangement and are not an additional inductance element such as an external Rogowski coil.

In general, the inductance component of the wiring ranges from approximately several nH (nano henries) to approximately dozens of nH. However, when the switching element is subjected to a short circuit, a large current flows within a short period of time, and thus a temporal differentiation of the current results in a high value. When a short circuit current of 10 kA flows at 1 μs, for example, the induction voltage generated by the inductance component of the wiring of 5 nH becomes 50 V, which can be sufficiently detected. Accordingly, by the induction voltage generated by the wiring inductance of the emitter side wiring or the collector side wiring being detected and this being compared to the predetermined threshold voltage, it can be quickly detected, even without the Rogowski coil being externally added, whether or not the current flowing through the switching element is the short circuit current.

In the electric power conversion device according to the aspect of the invention, the detection circuitry may be configured to detect the induction voltage generated in the emitter side wiring between an emitter detection point in the emitter side wiring on the emitter side of the switching element and a first detection point in the emitter side wiring lower in potential than the emitter detection point. In the electric power conversion device according to the aspect of the invention, the detection circuitry may be configured to detect the induction voltage generated in the collector side wiring between a collector detection point in the collector side wiring on the collector side of the switching element and a second detection point in the collector side wiring higher in potential than the collector detection point.

In the electric power conversion device according to the aspect of the invention, the switching element is subjected to a current flow from an electric power source on the collector side toward a ground on the emitter side. In this regard, the detection of the induction voltage generated by the wiring inductance of the emitter side wiring is performed between the emitter detection point in the emitter side wiring on the emitter side of the switching element and the first detection point further on the ground side and lower in potential than the emitter detection point. In addition, the detection of the induction voltage generated by the wiring inductance of the collector side wiring is performed between the collector detection point in the collector side wiring on the collector side of the switching element and the second detection point further on the electric power source side and higher in potential than the collector detection point. When the induction voltage detection points are disposed in the wiring as described above, it can be quickly detected whether or not the current flowing through the switching element is the short circuit current.

In the electric power conversion device according to the aspect of the invention, the detection circuitry may be configured to detect the induction voltage generated in the collector side wiring between a second detection point higher in potential than a collector detection point in the collector side wiring on the collector side of the switching element and an emitter detection point of the switching element. In a case where it is detected whether or not the current flowing through the switching element is the short circuit current based on the induction voltage generated in the collector side wiring when the switching element is turned ON, for example, the switching element has a low level of ON resistance. When the second detection point is taken in the vicinity of the collector detection point, for example, the potential of the second detection point becomes almost the same as the potential of the emitter detection point of the switching element. When a terminal for another purpose is already disposed on the collector side of the switching element, for example, the existing terminal can be used as the second detection point as it is, which is advantageous because a particular terminal for the detection of the induction voltage does not have to be used.

The electric power conversion device according to the aspect of the invention may further include an output circuitry configured to output a predetermined signal based on a result of the comparison by the comparison circuitry. In the electric power conversion device according to the aspect of the invention, the output circuitry may be configured to output the signal when the induction voltage is higher than the predetermined threshold voltage. By the induction voltage at a time when the current flowing through the switching element is the short circuit current being set to the predetermined threshold voltage, it can be detected whether or not the current flowing through the switching element is the short circuit current based on the comparison between the induction voltage and the predetermined threshold voltage. By the predetermined signal being output when the induction voltage is higher than the predetermined threshold voltage, it can be quickly detected that the current flowing through the switching element is the short circuit current.

The electric power conversion device according to the aspect of the invention may further include a gate monitor circuitry configured to monitor a gate voltage of the switching element, and the signal may be masked when the gate voltage measured by the gate monitor circuitry falls short of an ON threshold voltage of the switching element. The predetermined signal outputs the result of the comparison between the induction voltage and the predetermined threshold voltage, and thus the predetermined signal might be erroneously output when, for example, the switching element rises from OFF to ON. According to this configuration, however, the erroneous output of the predetermined signal at a time of the rise of the switching element from OFF to ON can be prevented.

The electric power conversion device according to the aspect of the invention may further include an inverter arm in which an upper arm switching element and a lower arm switching element are connected in series between an electric power source and a ground and an upper arm short circuit current detection circuitry configured to detect a short circuit current flowing through the upper arm switching element based on the induction voltage generated in the emitter side wiring of the upper arm switching element. The electric power conversion device according to the aspect of the invention may further include an inverter arm in which an upper arm switching element and a lower arm switching element are connected in series between an electric power source and a ground and a lower arm short circuit current detection circuitry configured to detect a short circuit current flowing through the lower arm switching element based on the induction voltage generated in the emitter side wiring of the lower arm switching element.

The electric power conversion device according to the aspect of the invention may further include an inverter arm in which an upper arm switching element and a lower arm switching element are connected in series between an electric power source and a ground and an upper arm short circuit current detection circuitry configured to detect a short circuit current flowing through the upper arm switching element based on the induction voltage generated in the collector side wiring of the upper arm switching element. The electric power conversion device according to the aspect of the invention may further include an inverter arm in which an upper arm switching element and a lower arm switching element are connected in series between an electric power source and a ground and a lower arm short circuit current detection circuitry configured to detect a short circuit current flowing through the lower arm switching element based on the induction voltage generated in the collector side wiring of the lower arm switching element.

For the short circuit of one of the two switching elements constituting the inverter arm to be detected, it may be detected whether or not the current flowing through the other switching element is excessive with the switching element subjected to the short circuit being turned OFF and the other switching element being turned ON. In this regard, the upper arm short circuit current detection circuitry is used when it is detected whether or not the current flowing through the upper arm switching element is the short circuit current based on the induction voltage generated in the upper arm collector side wiring. The lower arm short circuit current detection circuitry is used when it is detected whether or not the current flowing through the lower arm switching element is the short circuit current based on the induction voltage generated in the lower arm collector side wiring. Likewise, the upper arm short circuit current detection circuitry is used when it is detected whether or not the current flowing through the upper arm switching element is the short circuit current based on the induction voltage generated in the upper arm emitter side wiring. The lower arm short circuit current detection circuitry is used when it is detected whether or not the current flowing through the lower arm switching element is the short circuit current based on the induction voltage generated in the lower arm emitter side wiring. In this manner, it can be accurately and quickly detected whether or not the current flowing through the switching element is the short circuit current.

According to the electric power conversion device of the aspect of the invention, it can be quickly detected, even without the Rogowski coil being externally added, whether or not the current flowing through the switching element is the short circuit current.

BRIEF DESCRIPTION OF THE DRAWINGS

Features, advantages, and technical and industrial significance of exemplary embodiments of the invention will be described below with reference to the accompanying drawings, in which like numerals denote like elements, and wherein:

FIG. 6A is a timing chart illustrating the operation state of each element at the time of the normal operation without the short circuit fault of the upper arm switching element in the circuit configuration that is illustrated in FIG. 5A;

DETAILED DESCRIPTION OF EMBODIMENTS

Figure 1A:
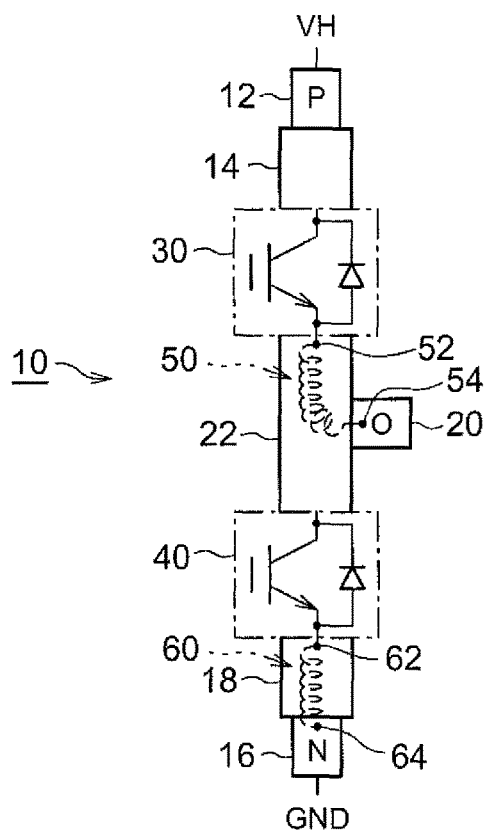
FIG. 1A is a circuit configuration diagram illustrating a wiring inductance of emitter side wiring and a detection point thereof in an inverter arm as an electric power conversion device according to an embodiment of the invention.

Hereinafter, an embodiment of the invention will be described in detail with reference to accompanying drawings. In the following description, a single inverter arm will be described as an electric power conversion device. It is an example for descriptive purposes, and the electric power conversion device may be configured to include a plurality of the inverter arms. For example, an electric power conversion device that is configured to include three inverter arms which are connected in parallel can be used in a drive circuit of a three-phase rotating electrical machine.

The inverter arm is a circuit device in which an upper arm switching element and a lower arm switching element are connected in series between an electric power source and a ground. The potential of the ground is lower than the potential of the electric power source, but it is not limited to 0 V. For example, the potential of the ground may be a negative potential.

In the following description, an insulated gate bipolar transistor (IGBT) will be described as the switching element. It is an example for descriptive purposes, and the switching element may be a metal oxide semiconductor field effect transistor (MOSFET) as well.

In the electric power conversion device, an induction voltage that is generated in collector side wiring or emitter side wiring when a current flows through the collector side wiring or the emitter side wiring is detected so that a detection of whether or not the current which flows through the switching element is a short circuit current is performed in a quick manner. Using a sense terminal-attached switching element is known as a method for performing the detection of whether or not the current flowing through the switching element is the short circuit current. The sense terminal picks out an extremely small part of the current that flows through the switching element. For example, it is detected whether or not the current flowing through the switching element is the short circuit current by the current equivalent to one-thousandth of the current flowing through the switching element being picked out from the sense terminal and being compared to a threshold current determined in advance. By this method, however, a quick detection cannot be performed because sensitivity is low due to a weak sense current and it takes time for the sense current to rise to the threshold current. In this regard, the electric power conversion device according to one form of the invention detects the induction voltage that is generated in the collector side wiring or the emitter side wiring when the current flows through the collector side wiring or the emitter side wiring.

In the following description, an emitter side and a collector side will be distinguished from each other with regard to a wiring inductance and an upper arm side and a lower arm side will be distinguished from each other with regard to a short circuit current detection unit for the simplicity of description. The wiring inductance, by nature, is present on both the emitter side and the collector side. In addition, in a structure in which the upper arm switching element and the lower arm switching element are connected in series, it is unknown in many cases which one of the switching elements is subjected to a short circuit fault. In a case where, for example, it is structurally apparent that the short circuit fault is frequent on either the upper arm side or the lower arm side, it is conceivable that a single short circuit current detection unit will suffice. Except for such a case, the short circuit current detection unit may be disposed on each of the upper arm side and the lower arm side.

In the following description, the same reference numerals will be used to refer to corresponding elements in all the drawings, and duplicate description will be omitted.

FIGS. 1A to 1D and FIGS. 2A to 2D are drawings illustrating wiring inductances of wirings and detection points thereof in an inverter arm 10 as the electric power conversion device.

The inverter arm 10 is a circuit device in which an upper arm switching element 30 and a lower arm switching element 40 are connected in series between the electric power source that is represented by VH and the ground that is represented by GND.

Each of the upper arm switching element 30 and the lower arm switching element 40 is an N channel-type IGBT, and a diode between the collector and the emitter is a reflux diode. A diode made on the same chip as the IGBT, such as an RC-IGBT, can be used as the reflux diode. Alternatively, the reflux diode can be made independently of and separately from an IGBT main body.

Each of the upper arm switching element 30 and the lower arm switching element 40 has the wiring inductance of the emitter side wiring and the wiring inductance of the collector side wiring. The wiring inductance of the emitter side wiring will be described first, and then the wiring inductance of the collector side wiring will be described.

Figure 1B:
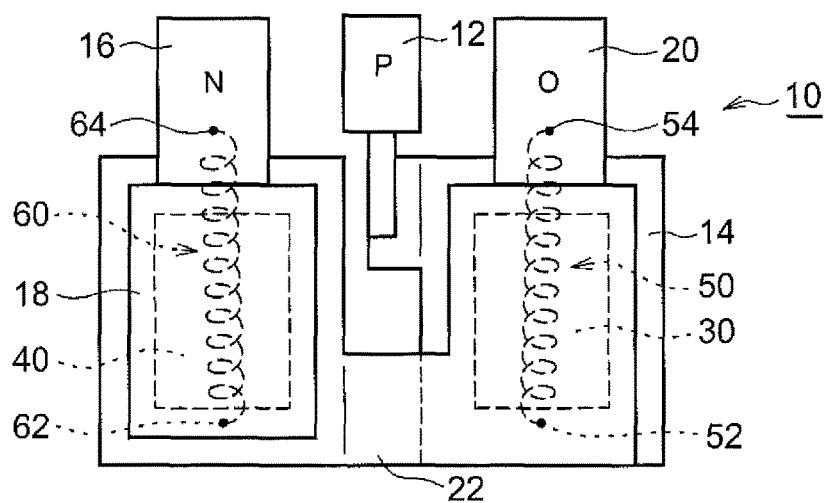
FIG. 1B is a planar structural view at a time of implementation of the configuration that is illustrated in FIG. 1A.
Figure 1C:
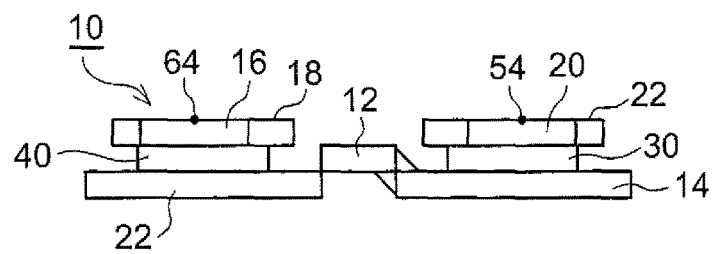
FIG. 1C is a side view of a terminal side at the time of the implementation of the configuration that is illustrated in FIG. 1A.
Figure 1D:
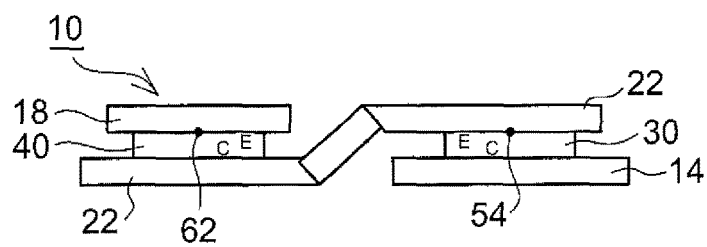
FIG. 1D is a side view of the side opposite to the terminal side at the time of the implementation of the configuration that is illustrated in FIG. 1A.

FIGS. 1A to 1D show the respective wiring inductances of the emitter side wiring and the respective detection points thereof of the upper arm switching element 30 and the lower arm switching element 40. FIG. 1A is a circuit configuration diagram of the inverter arm 10. FIG. 1B is a planar structural view of the inverter arm 10. FIG. 1C is a side view of a terminal side of the inverter arm 10, and FIG. 1D is a side view of the side opposite to the terminal side. The terminal side refers to a side where a terminal 12 that is connected to the electric power source and is represented by P, the other terminal 16 that is connected to the ground and is represented by N, and an output terminal 20 that is represented by O are placed.

The inverter arm 10 has respective elements connected in series in the following order in a direction toward the ground represented by GND from the electric power source represented by VH. The elements are connected in the order of the electric power source VH, the terminal 12, collector side wiring 14 of the upper arm switching element 30, the upper arm switching element 30, an intermediate bus bar 22, the lower arm switching element 40, emitter side wiring 18 of the lower arm switching element 40, the other terminal 16, and GND. The intermediate bus bar 22 is wiring in which the emitter side wiring of the upper arm switching element 30 and the collector side wiring of the lower arm switching element 40 are integrated with each other. The output terminal 20 of the inverter arm 10 is drawn out from the intermediate bus bar 22.

The terminal 12, the collector side wiring 14 of the upper arm switching element 30, the intermediate bus bar 22, the emitter side wiring 18 of the lower arm switching element 40, the other terminal 16, and the output terminal 20 are conductive plates. These are flat plates except for the intermediate bus bar 22.

As illustrated in FIGS. 1B, 1C, and 1D, the inverter arm 10 has a compact physical structure using the intermediate bus bar 22 that has a stepped structure which has lower and upper stages. In other words, the emitter (E) of the upper arm switching element 30 is connected to a lower surface of the upper stage of the intermediate bus bar 22, and the collector (C) of the lower arm switching element 40 is connected to an upper surface of the lower stage of the intermediate bus bar 22. The collector (C) of the upper arm switching element 30 is connected to an upper surface of the collector side wiring 14, and the terminal 12 is drawn out from the collector side wiring 14. The emitter (E) of the lower arm switching element 40 is connected to a lower surface of the emitter side wiring 18, and the other terminal 16 is drawn out from the emitter side wiring 18. The output terminal 20 is drawn out from the intermediate bus bar 22.

In FIGS. 1A and 1B, a wiring inductance 50 on the emitter side of the upper arm switching element 30 is an inductance component of a part of the intermediate bus bar 22 at the emitter side wiring of the upper arm switching element 30. The induction voltage is generated when the current flows therethrough. The detection of the induction voltage is performed between an emitter detection point 52 of the intermediate bus bar 22 on the emitter side of the upper arm switching element 30 and a first detection point 54 of the intermediate bus bar 22 on the output terminal 20 side. The potential of the first detection point 54 with respect to the wiring inductance 50 is lower than the potential of the emitter detection point 52. As illustrated in FIG. 1B, the first detection point 54 may be disposed on the intermediate bus bar 22 side of the output terminal 20.

A wiring inductance 60 on the emitter side of the lower arm switching element 40 is an inductance component of the emitter side wiring 18. The induction voltage is generated when the current flows therethrough. The detection of the induction voltage is performed between an emitter detection point 62 of the lower arm switching element 40 in the emitter side wiring 18 and a first detection point 64 of the emitter side wiring 18 on the other terminal 16 side. The potential of the first detection point 64 with respect to the wiring inductance 60 is lower than the potential of the emitter detection point 62. As illustrated in FIG. 1B, the first detection point 64 may be disposed on the emitter side wiring 18 side of the other terminal 16.

From that with the highest voltage to that with the lowest voltage, the respective terminals and detection points in FIG. 1A are lined up as follows. In other words, these are lined up in the order of the terminal 12, the emitter detection point 52 in the intermediate bus bar 22, the first detection point 54 in the intermediate bus bar 22, the output terminal 20, the emitter detection point 62 in the emitter side wiring 18, the first detection point 64 in the emitter side wiring 18, and the other terminal 16.

The emitter detection point 52 in the intermediate bus bar 22 and the first detection point 54 in the intermediate bus bar 22 correspond to detection units that detect the induction voltage of the emitter side wiring of the switching element 30, and an appropriate lead line or terminal is disposed in each thereof. Likewise, the emitter detection point 62 in the emitter side wiring 18 and the first detection point 64 in the emitter side wiring 18 correspond to detection units that detect the induction voltage of the emitter side wiring of the switching element 40, and an appropriate lead line or terminal is disposed in each thereof. The appropriate lead line or terminal is for connection to a connection terminal of a circuit comparing the magnitude of the induction voltage to a predetermined threshold voltage. A metallic wire for wire bonding or the like can be used as the appropriate lead line or terminal.

In FIGS. 1A and 1B, the wiring inductances 50, 60 are shown by dashed lines. This is to show that the wiring inductances 50, 60 are not individual elements additionally disposed in the form of external Rogowski coils or the like but inductance components inherent to the wiring. The same applies to the following diagram.

Figure 2A:
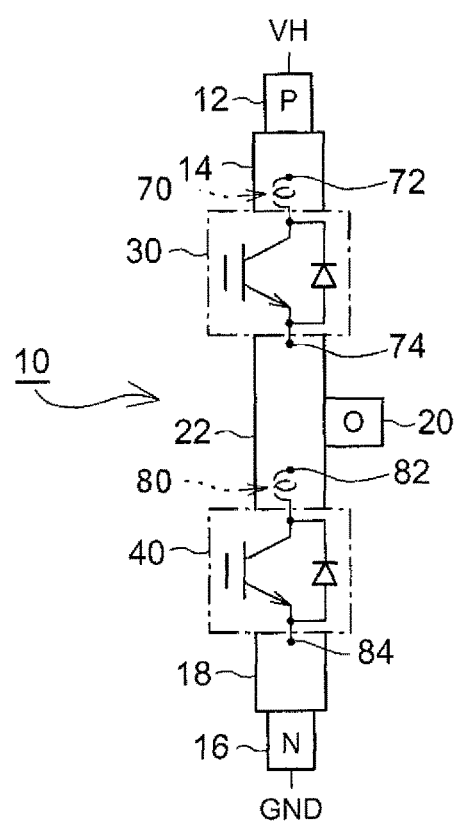
FIG. 2A is a circuit configuration diagram illustrating a wiring inductance of collector side wiring and a detection point thereof in the inverter arm as the electric power conversion device according to the embodiment of the invention.
Figure 2B:
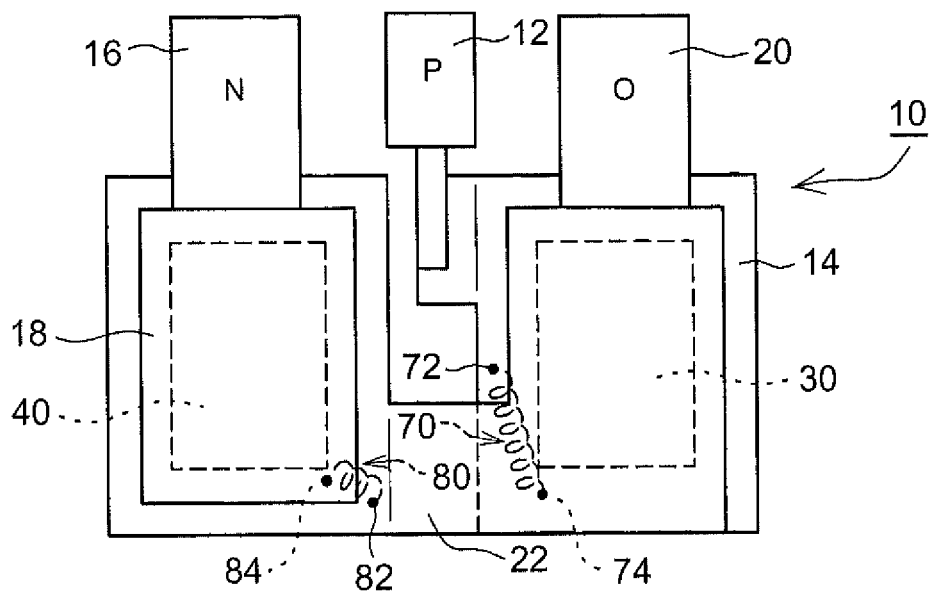
FIG. 2B is a planar structural view at a time of implementation of the configuration that is illustrated in FIG. 2A.
Figure 2C:
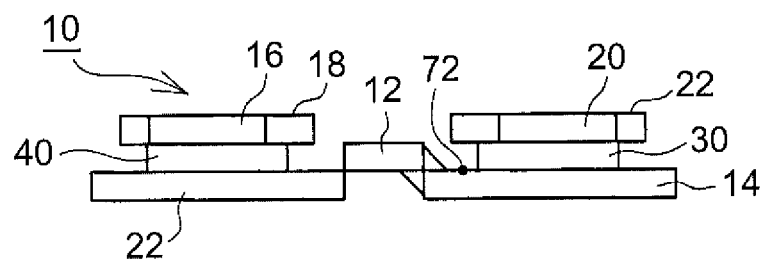
FIG. 2C is a side view of the terminal side at the time of the implementation of the configuration that is illustrated in FIG. 2A.
Figure 2D:
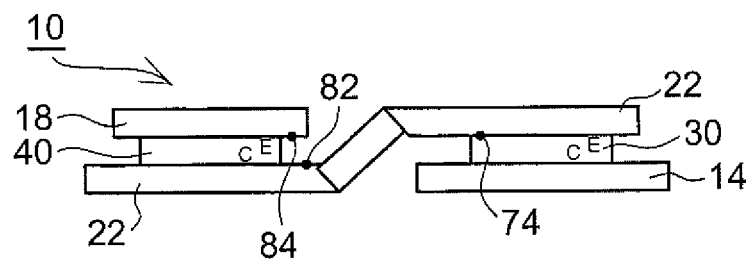
FIG. 2D is a side view of the side opposite to the terminal side at the time of the implementation of the configuration that is illustrated in FIG. 2A.

Hereinafter, the wiring inductance of the collector side wiring will be described. FIGS. 2A to 2D, which are drawings corresponding to FIGS. 1A to 1D, show the respective wiring inductances of the collector side wiring and the respective detection points thereof of the upper arm switching element 30 and the lower arm switching element 40. FIG. 2A is a circuit configuration diagram of the inverter arm 10. FIG. 2B is a planar structural view of the inverter arm 10. FIG. 2C is a side view of the terminal side of the inverter arm 10, and FIG. 2D is a side view of the side opposite to the terminal side.

In FIGS. 2A and 2B, a wiring inductance 70 on the collector side of the upper arm switching element 30 is an inductance component of the collector side wiring 14. The induction voltage is generated when the current flows therethrough. In addition, a wiring inductance 80 on the collector side of the lower arm switching element 40 is an inductance component of a part of the inter mediate bus bar 22 at the collector side wiring of the lower arm switching element 40. The induction voltage is generated when the current flows therethrough.

The detection of the induction voltage can be performed by voltage detection between the detection points at both ends of the respective wiring inductances 70, 80 as with the content described with reference to FIGS. 1A and 1B. The collector detection point of the upper arm switching element 30 and a second detection point 72 that is higher in potential than the collector detection point are used for the detection of the induction voltage on the collector side of the upper arm switching element 30. The collector detection point of the lower arm switching element 40 and a second detection point 82 that is higher in potential than the collector detection point are used for the detection of the induction voltage on the collector side of the lower arm switching element 40.

The detection of the induction voltage on the collector side of the upper arm switching element 30 can be performed between the second detection point 72 and an emitter detection point 74 of the upper arm switching element 30 instead of the collector detection point and the second detection point 72 being used. The upper arm switching element 30 is connected between second detection point 72 and the emitter detection point 74, but the inductance component in the upper arm switching element 30 is lower in value than the inductance component of the collector side wiring 14. Accordingly, the potential of the emitter detection point 74 is substantially the same as the potential of the collector detection point of the upper arm switching element 30.

Likewise, the detection of the induction voltage on the collector side of the lower arm switching element 40 can be performed between the second detection point 82 and an emitter detection point 84 of the lower arm switching element 40 instead of the collector detection point and the second detection point 82 being used.

From that with the highest voltage to that with the lowest voltage, the respective terminals and detection points in FIG. 2A are lined up as follows. These are lined up in the order of the terminal 12, the second detection point 72 in the collector side wiring 14, the emitter detection point 74 of the upper arm switching element 30, the output terminal 20, the second detection point 82 in the intermediate bus bar 22, the emitter detection point 84 of the lower arm switching element 40, and the other terminal 16.

Hereinafter, a circuit configuration of the short circuit current detection unit-attached electric power conversion device utilizing a quick current change rate detection capacity of the wiring inductance and a timing chart regarding an operation thereof will be described. During a drive control for the inverter arm 10 that is illustrated in FIGS. 1 and 2, one switching element is subjected to an OFF operation when the other switching element is subjected to an ON operation. An appropriate dead time is provided such that a through current flow is avoided and an ON-OFF timing of one and an ON-OFF timing of the other do not correspond to each other.

Either the upper arm switching element 30 or the lower arm switching element 40, which are connected in series, is subjected to the short circuit fault in two modes, one being a case where one of the switching elements is subjected to the short circuit fault when the other switching element is subjected to the OFF operation and the other being a case where one of the switching elements is subjected to the short circuit fault when the other switching element is subjected to the ON operation. Detection of the short circuit fault is performed by the switching element on the non-short circuit fault side. In the former method, however, the switching element that should perform the detection when the short circuit fault occurs remains OFF, and thus the detection is delayed by the dead time until that switching element is turned ON. In the latter method, the switching element that should perform the detection when the short circuit fault occurs is already in an ON state, and thus the short circuit fault detection can be performed in a quick manner.

In the following description, the short circuit fault is detected by the detection of whether or not the current that flows through the switching element which is in the ON operation is the short circuit current. In addition, the high current change rate detection capacity of the wiring inductance is used so that the detection is performed in a quick manner. In other words, the short circuit fault of the upper arm switching element 30 is detected by the wiring inductance of the lower arm switching element 40 being used for short circuit current detection purposes. The short circuit fault of the lower arm switching element 40 is detected by the wiring inductance of the upper arm switching element 30 being used for short circuit current detection purposes.

Figure 3A:
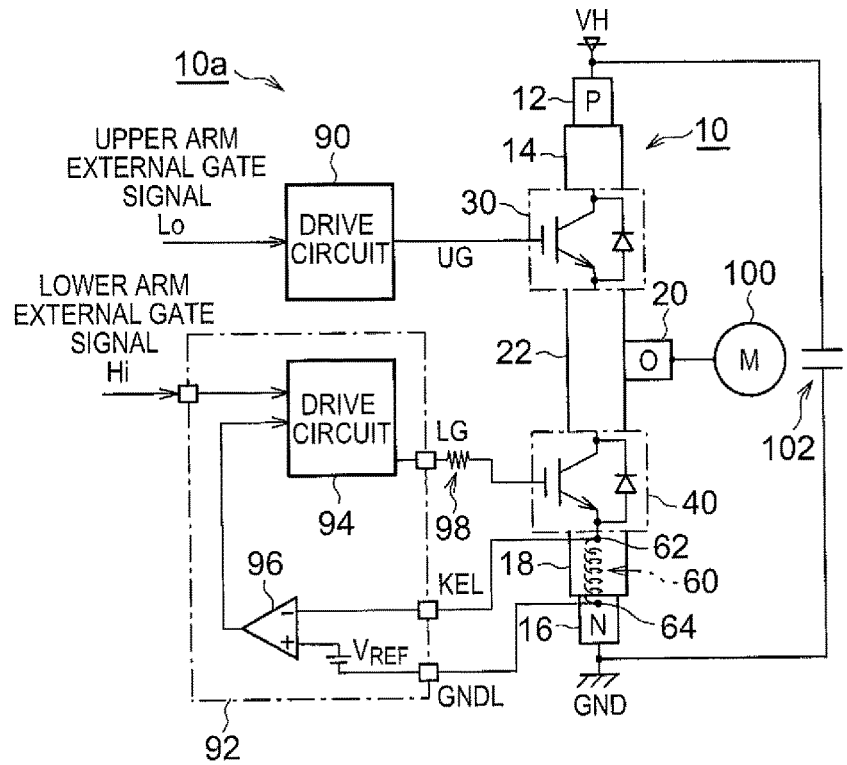
FIG. 3A is a circuit configuration diagram relating to a lower arm short circuit current detection unit at a time when short circuit current detection is performed by the use of the wiring inductance of the emitter side wiring in the inverter arm as the electric power conversion device according to the embodiment of the invention.
Figure 3B:
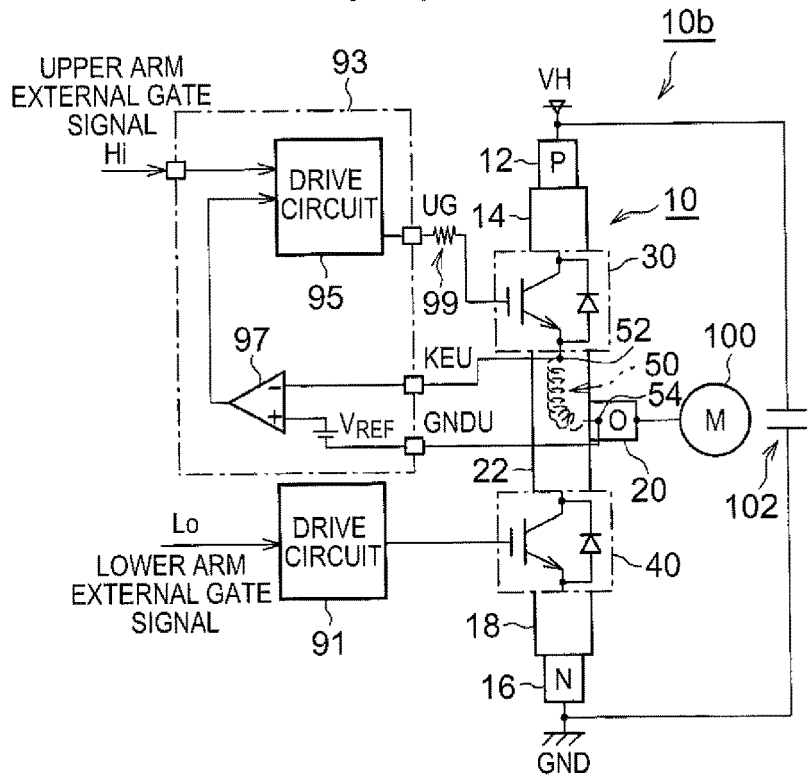
FIG. 3B, which corresponds to FIG. 3A, is a circuit configuration diagram relating to an upper arm short circuit current detection unit.

FIGS. 3A and 3B are circuit configuration diagrams of short circuit current detection unit-attached electric power conversion devices 10a, 10b using the wiring inductance of the emitter side wiring. FIG. 3A is a circuit configuration diagram at a time of the detection of the short circuit fault of the upper arm switching element 30, and FIG. 3B is a circuit configuration diagram at a time of the detection of the short circuit fault of the lower arm switching element 40. It is unknown whether the upper arm switching element 30 is subjected to the short circuit fault or the lower arm switching element 40 is subjected to the short circuit fault, and thus the electric power conversion device has a configuration in which the configuration that is illustrated in FIG. 3A and the configuration that is illustrated in FIG. 3B are combined with each other. In the following description, however, features of the two configurations for the short circuit fault detection will be separately described.

In the electric power conversion device 10a that is illustrated in FIG. 3A, a drive circuit 90 is a circuit that is connected to a gate of the upper arm switching element 30 of the inverter arm 10 and performs an ON-OFF control on the upper arm switching element 30. A short circuit current detection unit 92 includes a drive circuit 94 and a comparator 96 for the short circuit current detection therein. The short circuit current detection unit 92 is a lower arm short circuit current detection unit that is disposed on the lower arm switching element 40 side and detects the short circuit current which flows through the lower arm switching element 40 when the upper arm switching element 30 is subjected to the short circuit fault. The drive circuit 94 is a circuit of the same content as the drive circuit 90, and the drive circuit 94 is connected to a gate of the lower arm switching element 40 and performs an ON-OFF control on the lower arm switching element 40. A gate resistance 98 is a resistive element that adjusts a gate resistance of the lower arm switching element 40 to an appropriate value. A similar gate resistance 99 (refer to FIG. 3B) is disposed in the drive circuit 90 as well, but the gate resistance 99 is not illustrated in FIG. 3A. A rotating electrical machine 100 is an example of a load of the electric power conversion device 10a. A smoothing capacitor 102 is a capacitive element that suppresses a voltage fluctuation and a current fluctuation between the terminal 12 and the other terminal 16 of the inverter arm 10.

When the inverter arm 10 is in a normal operation, the current flows between the switching element and the rotating electrical machine 100. At this time, however, the current is limited by the inductance component of the rotating electrical machine 100, and thus a current change rate (di/dt) is relatively low. When the switching element is subjected to the short circuit fault, in contrast, the current directly flows into the switching element from the smoothing capacitor 102, and thus the current change rate (di/dt) is much higher and becomes as high as approximately 1,000 times that during the normal operation in some cases. Accordingly, the operation of the inverter arm 10 needs to be stopped with the short circuit fault of the switching element quickly detected.

In FIG. 3A, it is the upper arm switching element 30 that is subjected to the short circuit fault, and thus an external gate signal that is input to the drive circuit 90 of the upper arm switching element 30 is at a Lo level. An external gate signal that is input to the drive circuit 94 of the lower arm switching element 40 is at a Hi level. The Lo level is a gate voltage at which the switching element is turned OFF, and the Hi level is a gate voltage at which the switching element is turned ON.

The comparator 96 for the short circuit current detection is a comparison unit that compares the induction voltage generated in the wiring inductance 60 to a predetermined threshold voltage $V_{REF}$. In addition, the comparator 96 for the short circuit current detection is an output unit that outputs a predetermined signal based on a result of the comparison. The first detection point 64 of the wiring inductance 60 is connected to a plus side input terminal of the comparator 96, which is one of two input terminals of the comparator 96, via a reference voltage source that gives the predetermined threshold voltage $V_{REF}$ for the short circuit current detection. Furthermore, the emitter detection point 62 of the wiring inductance 60 is connected to a minus side input terminal. The comparator 96 outputs the Lo level when the voltage between the first detection point 64 and the emitter detection point 62 is lower than the threshold voltage $V_{REF}$ and outputs the Hi level when the voltage between the first detection point 64 and the emitter detection point 62 is equal to or higher than the threshold voltage $V_{REF}$. When the voltage between the first detection point 64 and the emitter detection point 62 is equal to or higher than the threshold voltage $V_{REF}$, the current that flows through the lower arm switching element 40 is an excessive short circuit current.

The threshold voltage $V_{REF}$ can be determined as an induction voltage that is generated when the short circuit current flows through the wiring inductance 60. This induction voltage is $\{(10\ kA/\mu s) \times 5\ nH\} = 50\ V$ when the current change rate (di/dt) of the short circuit current is 10 kA/μs and the magnitude of the wiring inductance 60 is 5 nH. When the threshold voltage $V_{REF}$ is 30 V, for example, the comparator 96 outputs the Hi level when the short circuit current flows through the lower arm switching element 40. In this manner, the comparator 96 that is disposed on the lower arm switching element 40 side performs the detection of the short circuit current flowing through the lower arm switching element 40 when the upper arm switching element 30 is subjected to the short circuit fault.

Although the wiring inductance 60 that has a magnitude of 5 nH has been described as an example above, a magnitude Lds of the wiring inductance that is required for the short circuit current to be allowed to be detected is obtained in the following manner. The magnitude Lds of the wiring inductance that is required for the short circuit current to be allowed to be detected is $Lds > \{Vdmin/(di/dt)sc\}$ when the comparator 96 has a minimum detection voltage of Vdmin and the current change rate at a time of a short circuit is (di/dt)sc. $Lds > \{30\ V/(10\ kA/\mu s)\}$ is 3 nH in the case of (di/dt)sc=10 kA/μs and Vdmin=threshold voltage $V_{REF}$=30 V. In the example described above, Lds is 5 nH, and thus this condition is satisfied. In another example, an Lds of approximately 1 nH will suffice in the case of Vdmin=threshold voltage $V_{REF}$=10 V. This magnitude is in a range that can be sufficiently covered by the wiring inductance with no additional Rogowski coil being disposed for the detection.

The drive circuit 94 takes AND of the external gate signal from an external control circuit (not illustrated) and an inversion signal of an output signal of the comparator 96 and inputs it to the gate of the lower arm switching element 40 as a lower arm gate voltage LG. Accordingly, when the output signal of the comparator 96 is at the Lo level, the lower arm switching element 40 is driven in response to the external gate signal. When the external gate signal is at the Hi level, the lower arm gate voltage LG reaches the Hi level and the lower arm switching element 40 is put into the ON state. When the output signal of the comparator 96 is at the Hi level, in contrast, the lower arm gate voltage LG reaches the Lo level regardless of the external gate signal and the lower arm switching element 40 is turned OFF. In this manner, the flow of the excessive short circuit current through the lower arm switching element 40 is detected and the lower arm switching element 40 is quickly turned OFF and protected.

FIG. 3B shows a circuit configuration at the time of the detection of the short circuit fault of the lower arm switching element 40. FIG. 3B is the same as FIG. 3A in basic configuration, and corresponding elements are illustrated with one being added to the reference numerals thereof. Herein, the external gate signal that is input to a drive circuit 91 of the lower arm switching element 40 is at the Lo level and the external gate signal that is input to a drive circuit 95 of the upper arm switching element 30 is at the Hi level.

It is the wiring inductance 50 at a part of the intermediate bus bar 22 corresponding to the emitter side wiring of the upper arm switching element 30 that is used for the short circuit fault detection. A short circuit current detection unit 93 is an upper arm short circuit current detection unit that is disposed on the upper arm switching element 30 side and detects the short circuit current which flows through the upper arm switching element 30 when the lower arm switching element 40 is subjected to the short circuit fault. The first detection point 54 of the wiring inductance 50 is connected to a plus side input terminal of a comparator 97, which is one of two input terminals of the comparator 97 in the short circuit current detection unit 93, via the reference voltage source that gives the threshold voltage $V_{REF}$ for the short circuit current detection. In addition, the emitter detection point 52 of the wiring inductance 50 is connected to a minus side input terminal.

In this configuration, the induction voltage is generated in the wiring inductance 50 when the lower arm switching element 40 is subjected to the short circuit and an excessive current flows through the upper arm switching element 30. When an output signal of the comparator 97 reaches the Hi level with this detected, an upper arm gate voltage UG reaches the Lo level regardless of the external gate signal and the upper arm switching element 30 is turned OFF. In this manner, the flow of the excessive short circuit current through the upper arm switching element 30 is detected and the upper arm switching element 30 is quickly turned OFF and protected.

Figure 4A:
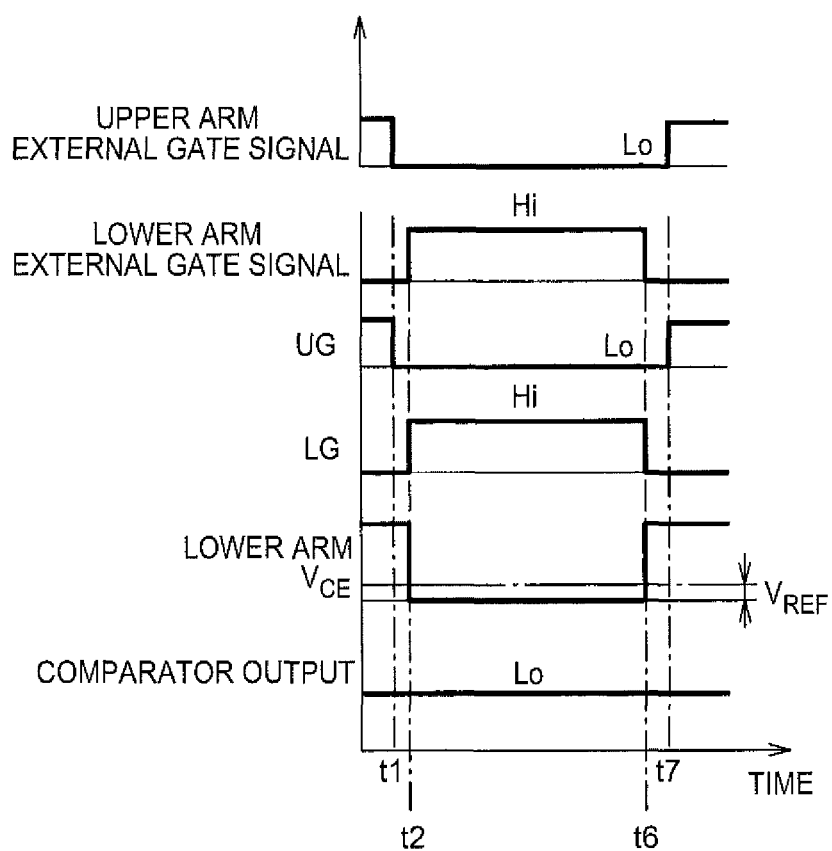
FIG. 4A is a timing chart illustrating an operation state of each element at a time of a normal operation without a short circuit fault of an upper arm switching element in the circuit configuration that is illustrated in FIG. 3A.
Figure 4B:
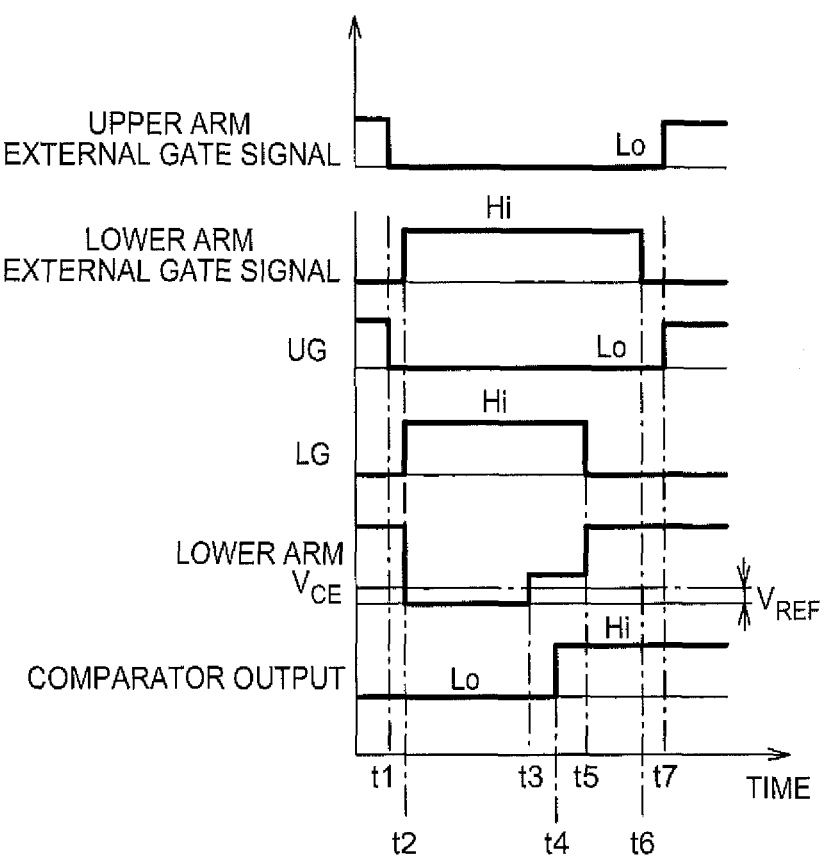
FIG. 4B, which is contrary to FIG. 4A, is a timing chart illustrating the operation state of each element at a time of the short circuit fault of the upper arm switching element.

As FIG. 3A and FIG. 3B are the same as each other in terms of configurational effect, the configurational effect will be described in more detail with reference to FIGS. 4A and 4B and FIG. 3A as a representative drawing. FIG. 4A is a timing chart illustrating a state of each element at a time of the normal operation of the inverter arm 10 without the short circuit fault of the upper arm switching element 30. FIG. 4B is a timing chart illustrating the state of each element at a time of the short circuit fault of the upper arm switching element 30. In each of the drawings, the horizontal axis represents time and the vertical axis represents a level state or a voltage state of each element. The uppermost stage on the vertical axis represents a level state of an upper arm external gate signal that is input to the drive circuit 90, and the second stage from an upper stage side represents a level state of a lower arm external gate signal that is input to the drive circuit 94. The third stage from the upper stage side represents a level state of the upper arm gate voltage UG, and the fourth stage from the upper stage side represents a level state of the lower arm gate voltage LG. The fifth stage from the upper stage side represents a voltage level of a voltage $V_{CE}$ between the collector and the emitter of the lower arm switching element 40, and the lowermost stage represents an output level of the comparator 96.

In FIG. 4A, in which the inverter arm 10 is in the normal operation, time t1 to time t7 is a period when the upper arm external gate signal is at the Lo level and time t2 to time t6 is a period when the lower arm external gate signal is at the Hi level. The period of time t1 to time t2 and the period of time t6 to time t7 are the dead times. The upper arm gate voltage UG changes with a delay corresponding to a circuit processing delay time of the drive circuit 90 from the upper arm external gate signal. In FIG. 4A, the upper arm gate voltage UG is at the Lo level from time t1 to time t7 with the circuit processing delay time being negligible, and the upper arm switching element 30 is turned OFF in this period. Likewise, the lower arm gate voltage LG changes with a delay corresponding to a circuit processing delay time of the drive circuit 94 from the lower arm external gate signal. In FIG. 4A, the lower arm gate voltage LG is at the Hi level from time t2 to time t6 with the circuit processing delay time being negligible, and the lower arm switching element 40 is turned ON in this period.

The voltage $V_{CE}$ between the collector and the emitter of the lower arm switching element 40 is a voltage resulting from an ON resistance being multiplied by an ON current when the lower arm switching element 40 is turned ON. In an example of the current change rate of the ON current, (di/dt) is approximately 10 A/μs. When the wiring inductance 60 has a magnitude of 5 nH, the induction voltage that is generated in the wiring inductance 60 is $\{(10 \text{ A/μs}) \times 5 \text{ nH}\} = 50$ mV. The voltage $V_{CE}$ between the collector and the emitter rises by this induction voltage.

The comparator 96 compares this induction voltage to the threshold voltage $V_{REF}$. The induction voltage is 50 mV from time t2 to time t6. The comparator 96 has a Lo level output with the threshold voltage $V_{REF}$ of the comparator 96 being at 30 V, and it is determined that the short circuit current does not flow through the lower arm switching element 40.

FIG. 4B is a timing chart at a time when the short circuit fault occurs in the upper arm switching element 30 at time t3. The content of the horizontal axis and the content of the vertical axis are the same as in FIG. 4A. Herein, the inverter arm 10 is in the normal operation, the voltage $V_{CE}$ between the collector and the emitter is 50 mV, and the output of the comparator 96 is at the Lo level until immediately before time t3. Once the short circuit fault occurs in the upper arm switching element 30 at time t3, the induction voltage is generated in the wiring inductance 60 almost at the same time as the short circuit current flows through the lower arm switching element 40. The induction voltage is $\{(10 \text{ kA/μs}) \times 5 \text{ nH}\} = 50$ V when the current change rate (di/dt) of the short circuit current is 10 kA/μs and the magnitude of the wiring inductance 60 is 5 nH.

The induction voltage is 50 V at time t3 when the induction voltage and the threshold voltage $V_{REF}$ are compared to each other as in FIG. 4A. The comparator 96 has a Hi level output with the threshold voltage $V_{REF}$ of the comparator 96 being at 30 V, and it is determined that the short circuit current flows through the lower arm switching element 40.

The comparator 96 has the circuit processing delay time, and thus the Hi level is output to the drive circuit 94 at time t4. The drive circuit 94 has the circuit processing delay time as well, and thus the lower arm switching element 40 is forcibly turned OFF at time t5. Time t5 is a timing earlier than time t6, when the lower arm external gate signal is turned OFF, and thus the lower arm switching element 40 is protected from impairment by the short circuit current. The period subsequent to time t6 is the same as that illustrated in FIG. 4A. As described above, the wiring inductance 60 has the high current change rate detection capacity, and thus can perform the short circuit current detection in a quick manner.

Figure 5A:
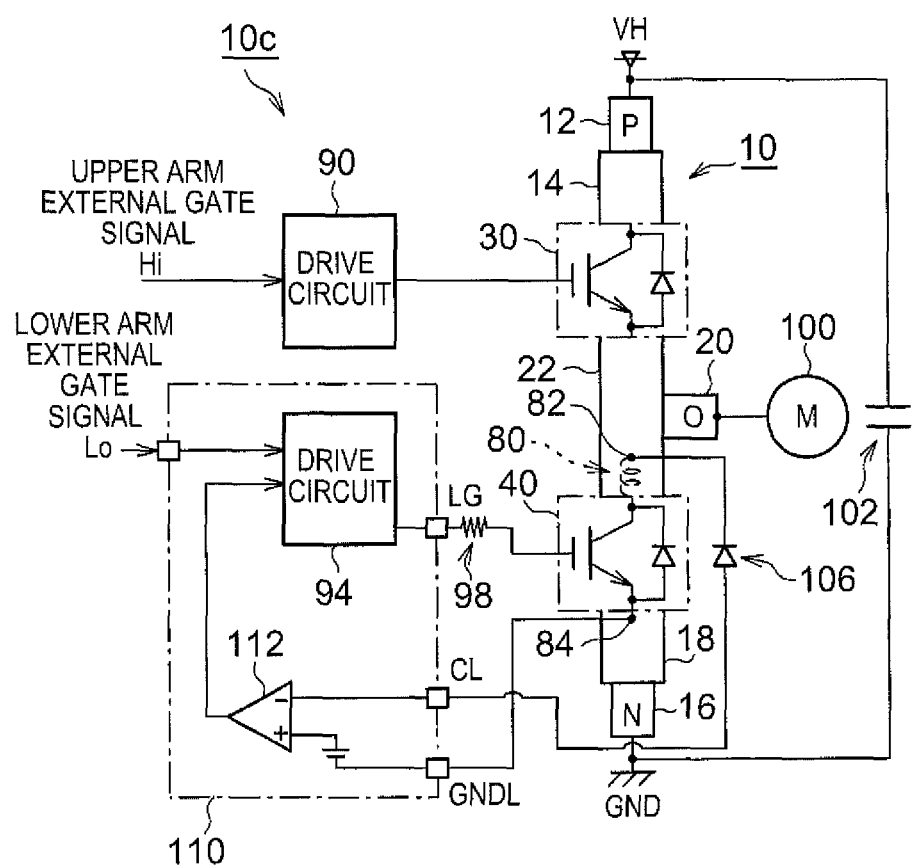
FIG. 5A is a circuit configuration diagram relating to the lower arm short circuit current detection unit at a time when the short circuit current detection is performed by the use of the wiring inductance of the collector side wiring in the inverter arm as the electric power conversion device according to the embodiment of the invention.
Figure 5B:
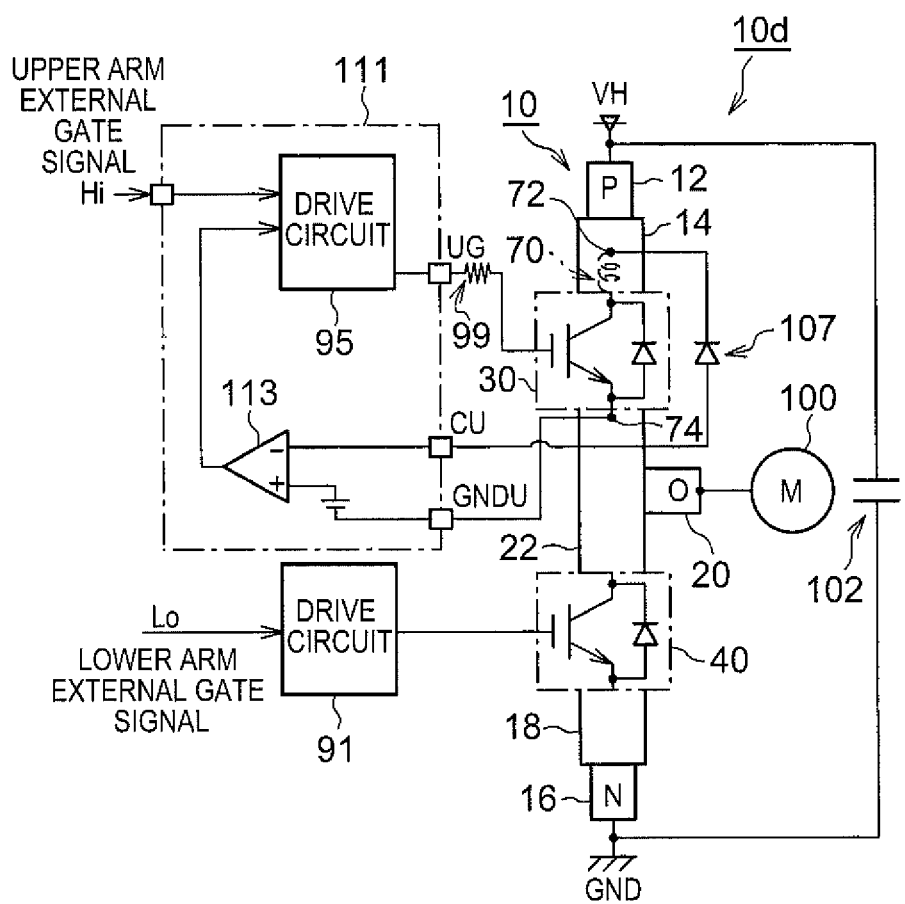
FIG. 5B, which corresponds to FIG. 5A, is a circuit configuration diagram relating to the upper arm short circuit current detection unit.

FIGS. 5A and 5B are circuit configuration diagrams of short circuit current detection unit-attached electric power conversion devices 10c, 10d using the wiring inductance of the collector side wiring. FIG. 5A is a circuit configuration diagram at a time of the detection of the short circuit fault of the upper arm switching element 30, and FIG. 5B is a circuit configuration diagram at a time of the detection of the short circuit fault of the lower arm switching element 40. As described with reference to FIGS. 3A and 3B, it is unknown whether the upper arm switching element 30 is subjected to the short circuit fault or the lower arm switching element 40 is subjected to the short circuit fault, and thus features of the two configurations for the short circuit fault detection will be separately described hereinbelow.

The electric power conversion device 10c in FIG. 5A, which detects the short circuit fault of the upper arm switching element 30, differs from the electric power conversion device 10a that is illustrated in FIG. 3A. Herein, the wiring inductance 80 at a part of the intermediate bus bar 22 corresponding to the collector side wiring of the lower arm switching element 40 is used for the short circuit current detection. The emitter detection point 84 of the wiring inductance 80 is connected to a plus side input terminal of a comparator 112, which is one of two input terminals of the comparator 112 for the short circuit current detection that is included in a short circuit current detection unit 110, via the reference voltage source that gives the threshold voltage $V_{REF}$ for the short circuit current detection. The second detection point 82 of the wiring inductance 80 is connected to a minus side input terminal. A diode 106 is a rectifier element that separates the inverter arm 10 operating at a high voltage and the short circuit current detection unit 110 operating at a low voltage from each other in terms of voltage, and has a cathode connected to the intermediate bus bar 22 and an anode connected to a CL terminal of the short circuit current detection unit 110. The CL terminal is the minus side input terminal of the comparator 112. The other elements are the same as in FIG. 3A.

When the wiring inductance 60 in the emitter side wiring described with reference to FIG. 3A is used, a voltage difference equivalent to the induction voltage generated in the wiring inductance 60 is generated between a ground side reference voltage of the inverter arm 10 and a ground side reference voltage of the short circuit current detection unit 92. By the wiring inductance 80 in the collector side wiring being used, however, the ground side reference voltage of the inverter arm 10 and the ground side reference voltage of the short circuit current detection unit 110 can become equal to each other and the accuracy of the short circuit fault detection can be improved. In addition, in a case where the diode 106 is disposed in advance for the purpose of, for example, monitoring a collector potential of the lower arm switching element 40, no particular lead line from the second detection point 82 is required. When the electric power conversion device is configured to include a plurality of the inverter arms, in particular, the lead line from the second detection point 82 is plural in number, and the lack of necessity for these contributes to a reduction in the size and cost of the electric power conversion device as a whole.

FIG. 5B is a circuit configuration diagram at the time of the detection of the short circuit fault of the lower arm switching element 40. FIG. 5B is the same as FIG. 5A in basic configuration, and corresponding elements are illustrated with one being added to the reference numerals thereof. The electric power conversion device 10d, which detects the short circuit fault of the lower arm switching element 40, differs from the electric power conversion device 10b that is illustrated in FIG. 3B. Herein, the wiring inductance 70 of the collector side wiring 14 of the upper arm switching element 30 is used for the short circuit current detection. The emitter detection point 74 of the wiring inductance 70 is connected to a plus side input terminal of a comparator 113, which is one of two input terminals of the comparator 113 for the short circuit current detection that is included in a short circuit current detection unit 111, via the reference voltage source that gives the threshold voltage $V_{REF}$ for the short circuit current detection. The second detection point 72 of the wiring inductance 70 is connected to a minus side input terminal. A diode 107 is a rectifier element that separates the inverter arm 10 operating at a high voltage and the short circuit current detection unit 111 operating at a low voltage from each other in terms of voltage, and has a cathode connected to the collector side wiring 14 and an anode connected to a CU terminal of the short circuit current detection unit 111. The CU terminal is the minus side input terminal of the comparator 113. The other elements are the same as in FIG. 3B.

Advantages of using the wiring inductance 70 in the collector side wiring instead of the wiring inductance 50 in the emitter side wiring described with reference to FIG. 3B are the same as the content described with reference to FIG. 5A.

Figure 6B:
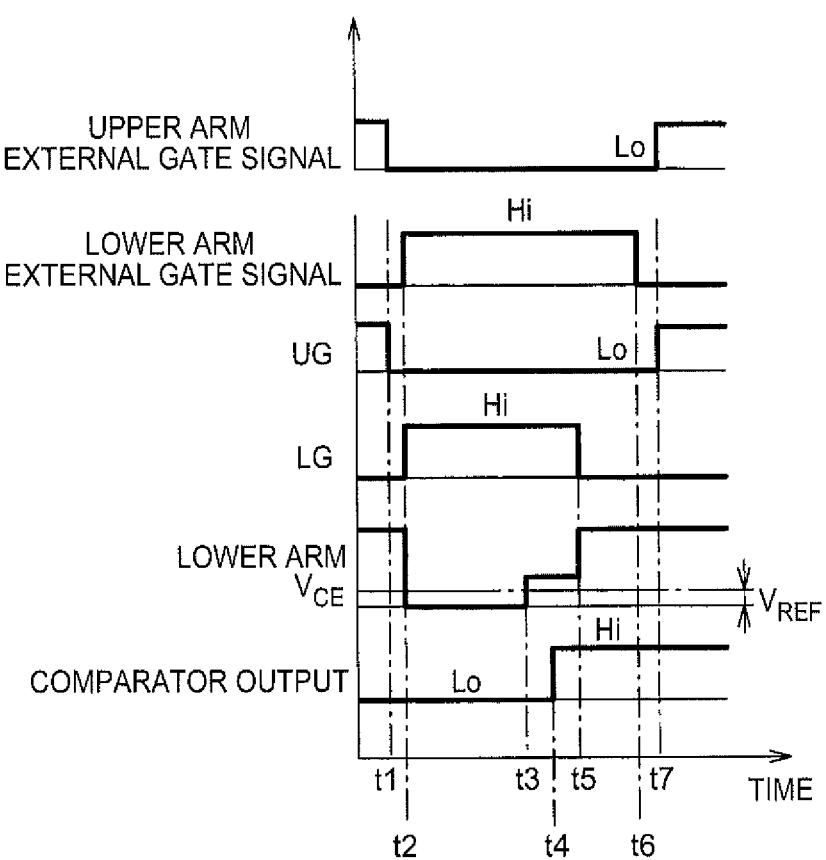
FIG. 6B, which is contrary to FIG. 6A, is a timing chart illustrating the operation state of each element at the time of the short circuit fault of the upper arm switching element.

As FIG. 5A and FIG. 5B are the same as each other in terms of configurational effect, the configurational effect will be described with reference to FIGS. 6A and 6B and FIG. 5A as a representative drawing. FIGS. 6A and 6B are drawings corresponding to FIGS. 4A and 4B. The content of the horizontal axis and the content of the vertical axis are the same as in FIGS. 4A and 4B.

In FIG. 6A, in which the inverter arm 10 is in the normal operation, the voltage $V_{CE}$ between the collector and the emitter of the lower arm switching element 40 is the voltage resulting from the ON resistance being multiplied by the ON current when the lower arm switching element 40 is turned ON. When the ON current has a current change rate of (di/dt)=10 A/μs and the wiring inductance 80 has a magnitude of 5 nH, the induction voltage that is generated in the wiring inductance 80 is {(10 A/μs)×5 nH}=50 mV. The voltage $V_{CE}$ between the collector and the emitter rises by this induction voltage.

The comparator 112 compares this induction voltage to the threshold voltage $V_{REF}$. The induction voltage is 50 mV from time t2 to time t6. The comparator 112 has a Lo level output with the threshold voltage $V_{REF}$ of the comparator 112 being at 30 V, and it is determined that the short circuit current does not flow through the lower arm switching element 40.

In FIG. 6B, which shows a time when the short circuit fault occurs in the upper arm switching element 30 at time t3, the inverter arm 10 is in the normal operation, the voltage $V_{CE}$ between the collector and the emitter is 50 mV, and the output of the comparator 112 is at the Lo level until immediately before time t3. Once the short circuit fault occurs in the upper arm switching element 30 at time t3, the induction voltage is generated in the wiring inductance 80 almost at the same time as the short circuit current flows through the lower arm switching element 40. The induction voltage is {(10 kA/μs)×5 nH}=50 V when the current change rate (di/dt) of the short circuit current is 10 kA/μs and the magnitude of the wiring inductance 80 is 5 nH.

The induction voltage is 50 V at time t3 when the induction voltage and the threshold voltage $V_{REF}$ are compared to each other. The comparator 112 has a Hi level output with the threshold voltage $V_{REF}$ of the comparator 112 being at 30 V, and it is determined that the short circuit current flows through the lower arm switching element 40.

As described above, the use of the wiring inductance 80 in the collector side wiring results in a timing chart similar to those in FIGS. 4A and 4B and effects similar to those achieved by the use of the wiring inductance 60 in the emitter side wiring.

In the above description, the comparators 112, 113 compare the induction voltages generated in the wiring inductances 80, 70 to the threshold voltage $V_{REF}$. In the circuit configuration diagrams illustrated in FIGS. 5A and 5B, the comparators 112, 113 detect the voltage between the collector and the emitter of the switching element. Depending on the degree of a time delay between the external gate signal and the gate signal that is given to the switching element, the comparators 112, 113 might erroneously detect the short circuit current and the short circuit current detection unit might malfunction.

Figure 7:
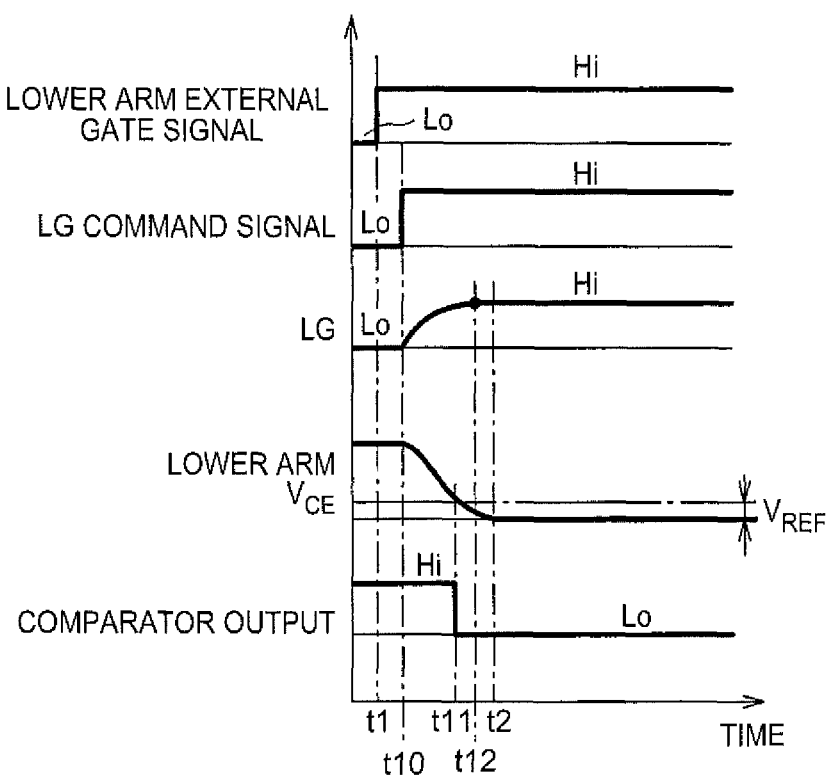
FIG. 7 is a timing chart illustrating the possibility of malfunctioning of the short circuit current detection in the circuit configuration that is illustrated in FIG. 5A.

FIG. 7 is timing charts that shows the possibility of the erroneous detection with regard to the comparator 112. In FIG. 7, the horizontal axis represents time and the vertical axis represents the level state or the voltage state of each element. The uppermost stage on the vertical axis represents the level state of the lower arm external gate signal. The second stage from the upper stage side represents a level state of a command signal with respect to the lower arm gate voltage LG of the lower arm switching element 40, and the third stage from the upper stage side represents the level state of the actual lower arm gate voltage LG in the lower arm switching element 40. The fourth stage from the upper stage side represents a voltage state of the voltage $V_{CE}$ between the collector and the emitter of the lower arm switching element 40, and the lowermost stage represents an output level of the comparator 112.

In FIG. 7, time t1 is the same as t1 in FIGS. 6A and 6B and represents a time when the lower arm external gate signal rises from the Lo level to the Hi level. Time t10 is a time when the command signal with respect to the lower arm gate voltage LG of the lower arm switching element 40 begins to rise with the lower arm external gate signal having risen to the Hi level. Time t2 is the same as t2 in FIGS. 6A and 6B. The time from time t1 to time t10 is an internal circuit processing delay time of the drive circuit 94. The time from time t10 to time t2 is a gate capacitance charging time of the lower arm switching element 40.

The lower arm gate voltage LG of the lower arm switching element 40 begins to rise from the Lo level of time t10 and rises in response to a constant at a time of gate capacitance charging. The rise is completed at time t2. This causes the voltage $V_{CE}$ between the collector and the emitter of the lower arm switching element 40 to begin to fall from time t10 and the fall to terminate at time t2. Time t12, which is a time when time t2 has yet to be reached, is a time when the lower arm gate voltage LG reaches an ON threshold voltage at which the lower arm switching element 40 is switched from OFF to ON. Time t2, which is reached after a significant progress from time t12, corresponds to a time when the voltage $V_{CE}$ between the collector and the emitter of the lower arm switching element 40 is sufficiently put into a saturation state.

The comparator 112 detects the voltage between the second detection point 82 and the emitter detection point 84. Accordingly, even when no current flows through the wiring inductance 80, the Hi level is output until time t11 when the voltage $V_{CE}$ between the collector and the emitter of the lower arm switching element 40 falls to the threshold voltage $V_{REF}$ determined with regard to the induction voltage. This Hi level output represents a state where the lower arm switching element 40 undergoes a transition from OFF to ON and does not represent the short circuit current detection. Depending on the degree of a circuit processing delay from the external gate signal to the gate signal given to the switching element, the comparator 112 outputs the Hi level despite the lack of the flow of the short circuit current through the lower arm switching element 40, and thus the erroneous detection occurs with regard to the short circuit current. When the erroneous detection occurs in the comparator 112, the drive circuit for the lower arm switching element 40 malfunctions.

Figure 8A:
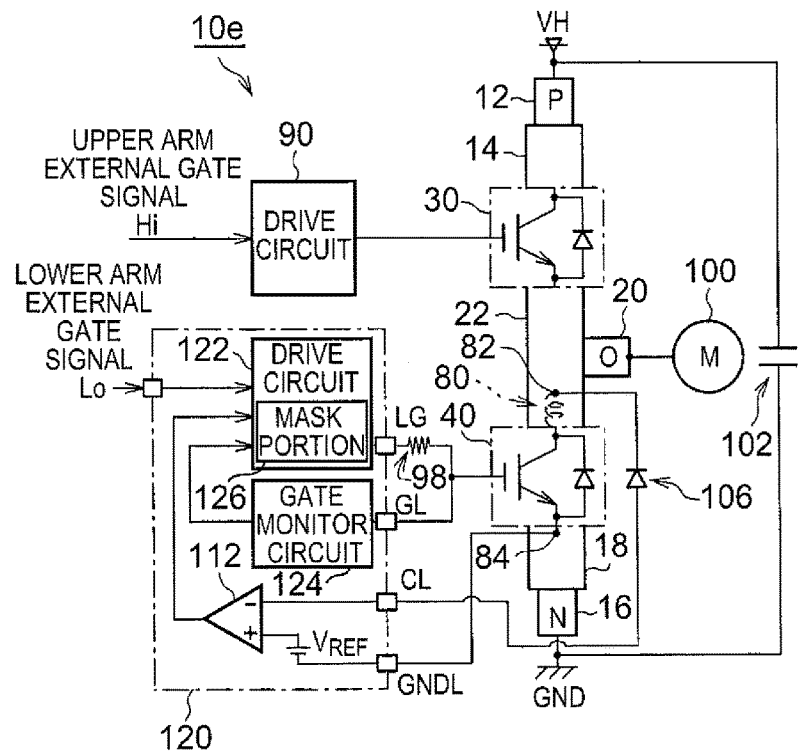
FIG. 8A, which is associated with FIG. 5A, is a circuit configuration diagram relating to the lower arm short circuit current detection unit at a time when the malfunctioning of the short circuit current detection is prevented by the use of gate voltage detection.
Figure 8B:
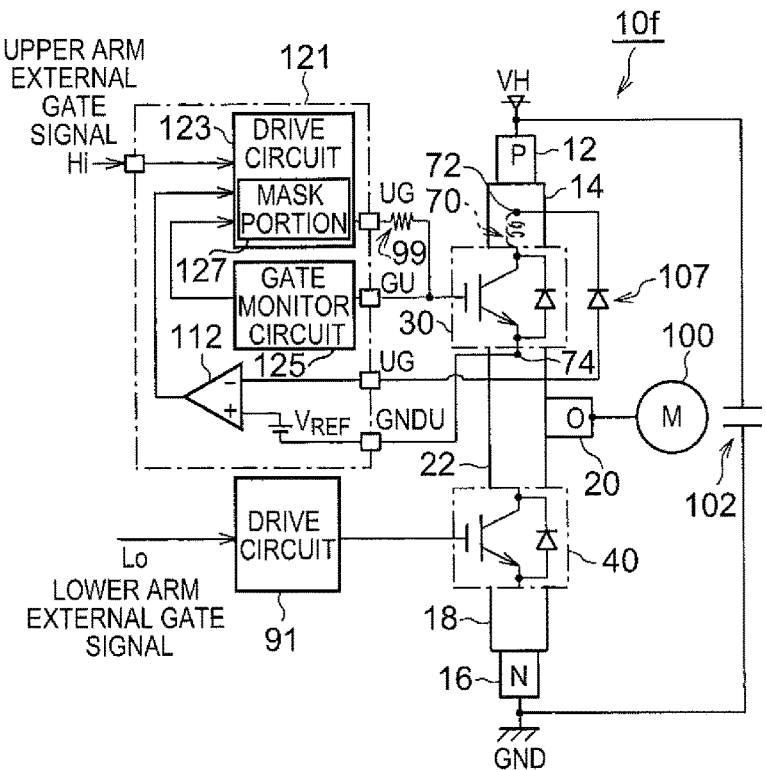
FIG. 8B, which corresponds to FIG. 8A, is a circuit configuration diagram relating to the upper arm short circuit current detection unit.

FIGS. 8A and 8B are drawings showing a circuit configuration of an electric power conversion device that prevents the malfunctioning of the short circuit current detection unit which can occur at a time of the transition of the switching element from OFF to ON. FIG. 8A is a circuit configuration diagram of an electric power conversion device 10e that prevents the malfunctioning of a short circuit current detection unit 120 which detects the short circuit fault of the upper arm switching element 30. FIG. 8B is a circuit configuration diagram of an electric power conversion device 10f that prevents the malfunctioning of a short circuit current detection unit 121 which detects the short circuit fault of the lower arm switching element 40.

FIG. 8A regarding the detection of the short circuit fault of the upper arm switching element 30 differs from FIG. 6A in that a gate monitor circuit 124 is disposed in the short circuit current detection unit 120 and a mask portion 126 is disposed in a drive circuit 122 included in the short circuit current detection unit 120. The other elements are the same as in FIG. 6A.

The gate monitor circuit 124 that is disposed in the short circuit current detection unit 120 directly acquires the gate voltage of the lower arm switching element 40. Then, the acquired gate voltage is monitored with reference to a gate ON threshold voltage determined in advance so that it is monitored whether or not the acquired gate voltage is equal to or higher than the ON threshold voltage, and then a result thereof is output. The direct acquisition means the acquisition of the actual gate voltage in the lower arm switching element 40 instead of external gate signal acquisition and the acquisition of a gate voltage command signal which the drive circuit 122 outputs in response to the external gate signal. Regarding a monitoring result output method, the Hi level is output when the acquired gate voltage is lower than the ON threshold voltage and the Lo level is output when the acquired gate voltage is equal to or higher than the ON threshold voltage.

The mask portion 126 that is disposed in the drive circuit 122 masks an output signal of the comparator 112, by using the output signal from the comparator 112 and an output signal from the gate monitor circuit 124, when the output signal from the gate monitor circuit 124 is at the Hi level. To mask the output signal of the comparator 112 means a circuit outputting the Lo level by hiding the output signal of the comparator 112 even when the output signal of the comparator 112 is at the Hi level.

When the mask portion 126 is used, the signal of the comparator 112 remains a Lo level signal in the drive circuit 122 until time t12 in FIG. 7 even if the output signal of the comparator 112 is at the Hi level. Accordingly, the malfunctioning of the short circuit current detection unit 120 is prevented.

FIG. 8B regarding the detection of the short circuit fault of the lower arm switching element 40 is the same as FIG. 8A in basic configuration, and corresponding elements are illustrated with one being added to the reference numerals thereof. Herein, a gate monitor circuit 125 is disposed in the short circuit current detection unit 121 and a mask portion 127 is disposed in a drive circuit 123 included in the short circuit current detection unit 121. Content regarding the gate monitor circuit 125 and content regarding the mask portion 127 are similar to those regarding the gate monitor circuit 124 and the mask portion 126 illustrated in FIG. 8A, and thus detailed description thereof will be omitted.

Figure 9A:
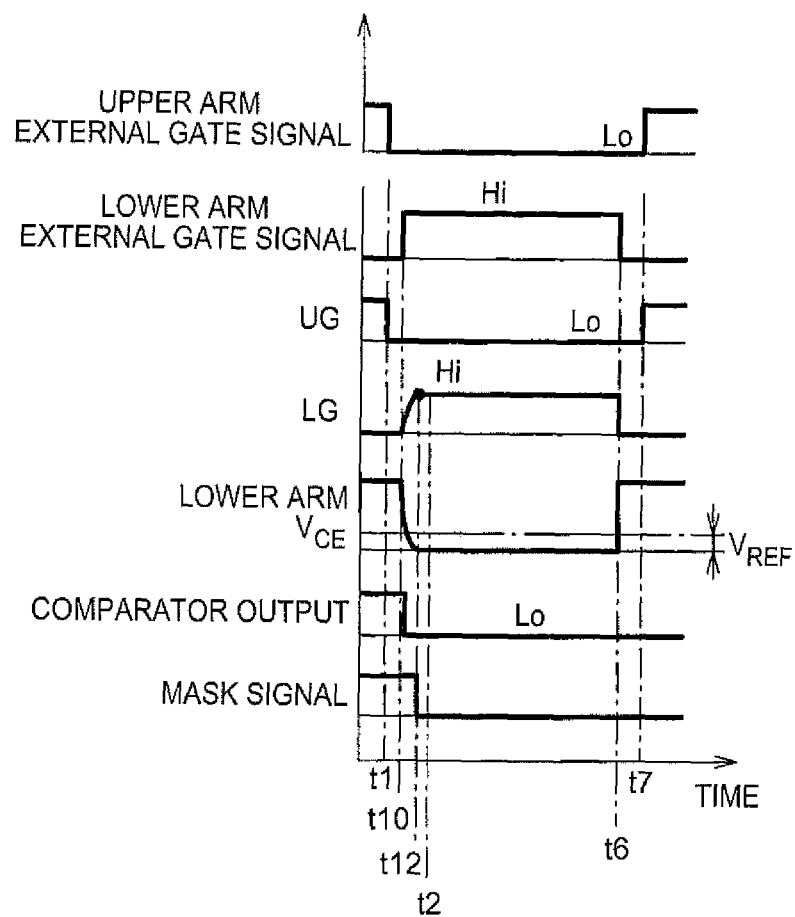
FIG. 9A is a timing chart illustrating the operation state of each element, including a mask signal, at the time of the normal operation without the short circuit fault of the upper arm switching element in the circuit configuration that is illustrated in FIG. 8A.
Figure 9B:
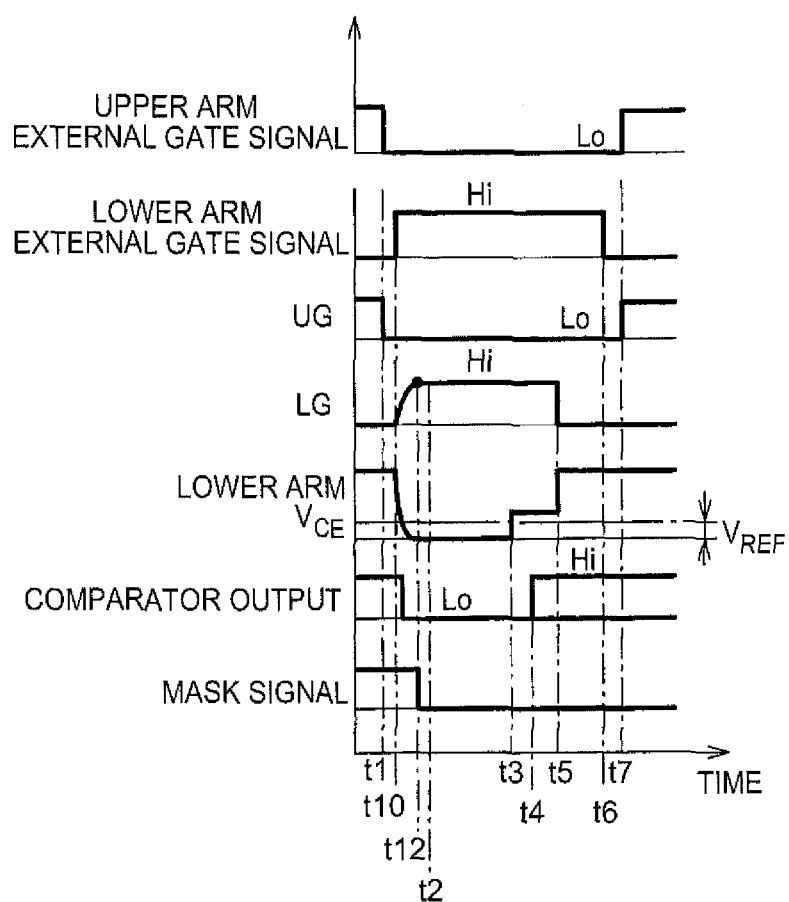
FIG. 9B, which is contrary to FIG. 9A, is a timing chart illustrating the operation state of each element, including the mask signal, at the time of the short circuit fault of the upper arm switching element.

As FIG. 8A and FIG. 8B are the same as each other in terms of configurational effect, the configurational effect will be described with reference to FIGS. 9A and 9B and FIG. 8A as a representative drawing. FIGS. 9A and 9B are drawings corresponding to FIGS. 6A and 6B. The horizontal axis represents time as in FIGS. 6A and 6B, but times t10 and t12 described with reference to FIG. 7 are added thereto. The vertical axis represents an operation level of the voltage state of each element as in FIGS. 6A and 6B, but the operation level of a mask signal is added to the lowermost stage thereof. In addition, the waveform of the actual lower arm gate voltage LG of the lower arm switching element 40 and the waveform of the voltage $V_{CE}$ between the collector and the emitter of the lower arm switching element 40 correspond to the waveforms described with reference to FIG. 7.

When the inverter arm 10 is in the normal operation, the Hi level is output as the output of the comparator 112, as illustrated in FIG. 9A, until the voltage $V_{CE}$ between the collector and the emitter of the lower arm switching element 40 falls to the threshold voltage $V_{REF}$ set with regard to the induction voltage. With respect to this erroneous detection of the comparator 112, the mask signal outputs the Hi level until time t12. Time t12 is a time when the gate voltage of the lower arm switching element 40 rises to reach the ON threshold voltage. In this manner, the malfunctioning of the short circuit current detection unit 120 is prevented when the lower arm switching element 40 undergoes the transition from OFF to ON during the normal operation of the inverter arm 10.

Likewise, in FIG. 9B showing a time when the inverter arm 10 is subjected to the short circuit fault at time t3, the malfunctioning of the short circuit current detection unit 120 is also prevented when the lower arm switching element 40 undergoes the transition from OFF to ON. Then, after time t3, the short circuit fault detection can be performed in a quick manner since the wiring inductance 80 has the high current change rate detection capacity as described with reference to FIG. 6B.

What is claimed is:

1. An electric power conversion device comprising:
   a switching element;
   a collector side wiring connected to a collector side of the switching element;
   an emitter side wiring connected to an emitter side of the switching element;
   a detection circuitry configured to detect an induction voltage generated in the collector side wiring when a current flows through the collector side wiring or the emitter side wiring; and
   a comparison circuitry configured to compare the induction voltage and a predetermined threshold voltage determined in advance to each other.

2. The electric power conversion device according to claim 1,
   wherein the detection circuitry is configured to detect the induction voltage generated in the emitter side wiring between an emitter detection point in the emitter side wiring on the emitter side of the switching element and a first detection point in the emitter side wiring lower in potential than the emitter detection point.

3. The electric power conversion device according to claim 1,
   wherein the detection circuitry is configured to detect the induction voltage generated in the collector side wiring between a collector detection point in the collector side wiring on the collector side of the switching element and a second detection point in the collector side wiring higher in potential than the collector detection point.

4. The electric power conversion device according to claim 1,
   wherein the detection circuitry is configured to detect the induction voltage generated in the collector side wiring between a second detection point higher in potential than a collector detection point and an emitter detection point of the switching element, the collector detection point being located in the collector side wiring on the collector side of the switching element.

5. The electric power conversion device according to claim 1, further comprising:
   an output circuitry configured to output a predetermined signal based on a result of the comparison by the comparison circuitry.

6. The electric power conversion device according to claim 5,
   wherein the output circuitry is configured to output the signal when the induction voltage is higher than the predetermined threshold voltage.

7. The electric power conversion device according to claim 5, further comprising:
   a gate monitor circuitry configured to monitor a gate voltage of the switching element,
   wherein the signal is masked when the gate voltage measured by the gate monitor circuitry falls short of an ON threshold voltage of the switching element.

8. The electric power conversion device according to claim 1, further comprising:
   an inverter arm in which an upper arm switching element and a lower arm switching element are connected in series between an electric power source and a ground; and
   an upper arm short circuit current detection circuitry configured to detect a short circuit current flowing through the upper arm switching element based on the induction voltage generated in the emitter side wiring of the upper arm switching element.

9. The electric power conversion device according to claim 1, further comprising:
   an inverter arm in which an upper arm switching element and a lower arm switching element are connected in series between an electric power source and a ground; and
   a lower arm short circuit current detection circuitry configured to detect a short circuit current flowing through the lower arm switching element based on the induction voltage generated in the emitter side wiring of the lower arm switching element.

10. The electric power conversion device according to claim 1, further comprising:
    an inverter arm in which an upper arm switching element and a lower arm switching element are connected in series between an electric power source and a ground; and
    an upper arm short circuit current detection circuitry configured to detect a short circuit current flowing through the upper arm switching element based on the induction voltage generated in the collector side wiring of the upper arm switching element.

11. The electric power conversion device according to claim 1, further comprising:
    an inverter arm in which an upper arm switching element and a lower arm switching element are connected in series between an electric power source and a ground; and
    a lower arm short circuit current detection circuitry configured to detect a short circuit current flowing through the lower arm switching element based on the induction voltage generated in the collector side wiring of the lower arm switching element.

* * * * *